US008188366B2

(12) United States Patent
Hecht

(10) Patent No.: US 8,188,366 B2
(45) Date of Patent: May 29, 2012

(54) INTEGRATED SOLAR ENERGY CONVERSION SYSTEM, METHOD, AND APPARATUS

(75) Inventor: Daniel H. Hecht, Fort Worth, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 188 days.

(21) Appl. No.: 12/792,004

(22) Filed: Jun. 2, 2010

(65) Prior Publication Data
US 2010/0269880 A1     Oct. 28, 2010

Related U.S. Application Data

(62) Division of application No. 11/455,596, filed on Jun. 19, 2006, now abandoned.

(51) Int. Cl.
*H01L 31/00* (2006.01)
(52) U.S. Cl. ......... 136/259; 136/206; 136/246; 136/253
(58) Field of Classification Search ............ 136/206, 136/246, 253, 259
See application file for complete search history.

(56) References Cited

U.S. PATENT DOCUMENTS

| 4,106,952 | A * | 8/1978 | Kravitz | 136/206 |
| 6,313,391 | B1 * | 11/2001 | Abbott | 136/200 |
| 6,434,942 | B1 | 8/2002 | Charlton | |
| 6,469,241 | B1 | 10/2002 | Penn | |
| 6,672,064 | B2 | 1/2004 | Lawheed | |
| 2004/0055300 | A1 | 3/2004 | Lawheed | |
| 2007/0251569 | A1 * | 11/2007 | Shan et al. | 136/246 |

FOREIGN PATENT DOCUMENTS

DE     42 06 931 A1     9/1993
* cited by examiner

*Primary Examiner* — Basia Ridley
*Assistant Examiner* — Thanh-Truc Trinh
(74) *Attorney, Agent, or Firm* — Bracewell & Giuliani LLP

(57) ABSTRACT

A solar energy conversion package includes a photovoltaic (PV) cell, a thermionic or thermoelectric conversion unit and a thermal heating system. Solar radiation is concentrated by a lens or reflector and directed to the PV cell for electrical power conversion. A water circulation system maintains the PV cell at working temperatures. The thermionic or thermoelectric conversion cell is coupled between these cells in the thermal path to generate additional power. Additional efficiencies may be gained by partitioning the solar radiation with prisms or wavelength specific filters or reflective coatings into discrete spectrum segments optimized for each conversion unit for maximizing efficiency of electrical energy conversion and equipment design. Integrating all three of these conversion techniques produces a synergistic system that exceeds the performance conventional solar conversion systems.

12 Claims, 5 Drawing Sheets

INTEGRATED SOLAR ENERGY CONVERSION SYSTEM, METHOD, AND APPARATUS

This application is a divisional of application Ser. No. 11/455,596, filed Jun. 19, 2006.

BACKGROUND OF THE INVENTION

1. Technical Field

The present invention relates in general to harnessing solar energy and, in particular, to an improved system, method, and apparatus for integrating the conversion of solar energy into a variety of usable energy forms.

2. Description of the Related Art

In the prior art, solar energy conversion systems attempt to use a single energy conversion mechanism to achieve an efficiency that would make them economically feasible. Reaching a sufficiently high rate of power conversion for broad-based economic viability is difficult if not impossible at present and has restrained the growth of the solar energy industry.

For example, one national solar power program achieved about 34% electric conversion efficiency at 660 suns concentration. Despite the high conversion compared with the commercial state of the art, this system's single conversion process only utilized a portion of the spectrum efficiently. However, that solution also created very high thermal fluxes and engineering difficulties. In addition, the extremely high efficiency of that system was limited to a laboratory bench photovoltaic (PV) prototype.

More practical models, such as lower complexity, flat panel solar energy systems are less costly per unit area, but achieve approximately half or less of the conversion rate of the concentrated systems. Furthermore, they require much more usable area to produce the required power. Overall, the lower efficiency of these expensive types of solar energy conversion modules makes them economically feasible only in remote locations requiring extensive infrastructure improvements for standard power installations. Thus, an improved solar energy conversion system would be desirable.

SUMMARY OF THE INVENTION

One embodiment of the present invention comprises a solar energy conversion package that incorporates two solar energy conversion methods of photovoltaics (PV) and thermal-steam powered energy generation or heating. In addition, a thermionic or thermoelectric conversion unit is also utilized. Although not usually considered for solar applications, thermionic conversion is typically used with a nuclear power source for remote power generation (e.g., spacecraft) or technical instruments. Integrating all three types of these solar conversion techniques in a concentrated configuration produces a synergistic system that exceeds the performance of present solar conversion systems.

In one embodiment, solar radiation is initially concentrated by lenses or reflectors to reduce the cost of highly efficient conversion units (e.g., target concentration of 200:1; range 10:1 to 1000:1). The light is directed to a PV cell with a conversion efficiency rating of about 14% (e.g., SOTA commercial) to 28.5% (e.g., SOTA space) to electrical power, while absorbing much of the excess energy as heat. To maintain the PV cell at an acceptable temperature for long life, a water circulation system is used to pull off excess thermal energy. The hot water may be used for hot water applications, heating, radiant flooring in domestic applications, and/or low quality heating for commercial applications.

The first two conversion units set up the proper boundary conditions for a thermoelectric (TE) cell, which acts as the third conversion unit. The TE cell is coupled into the thermal path to generate power. Commercial TE units offer only about 2% to 7.5% efficiencies for converting electrical energy to heat. However, semiconductor based, thermal diode units can produce electrical energy at about 40% efficiency of the Carnot Cycle potential, which yields up to about 25% conversion efficiency for the incoming solar flux. The combination of these three conversion units are sandwiched in the path of the solar radiation. Each of the three units produce power from portions of the radiation spectrum that are poorly utilized by the other devices. Together, they synergistically yield about 50% or more conversion of the solar energy spectrum. Theoretical efficiencies are in excess of 60% are expected as these technologies further develop, with much of the energy conversion in the preferred form of electrical power.

The integrated approach of the present invention uses components within their operating limits and produces more electrical energy than previously possible while remaining within engineering parameters to optimize output with respect to the local solar environment and the needs of the user. In addition, these very high efficiency units can be readily incorporated into inherently modular designs at a high economic return on investment.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the mariner in which the features and advantages of the present invention, which will become apparent, are attained and can be understood in more detail, more particular description of the invention briefly summarized above may be had by reference to the embodiments thereof that are illustrated in the appended drawings which form a part of this specification. It is to be noted, however, that the drawings illustrate only some embodiments of the invention and therefore are not to be considered limiting of its scope as the invention may admit to other equally effective embodiments.

DETAILED DESCRIPTION OF THE INVENTION

Figure 1:
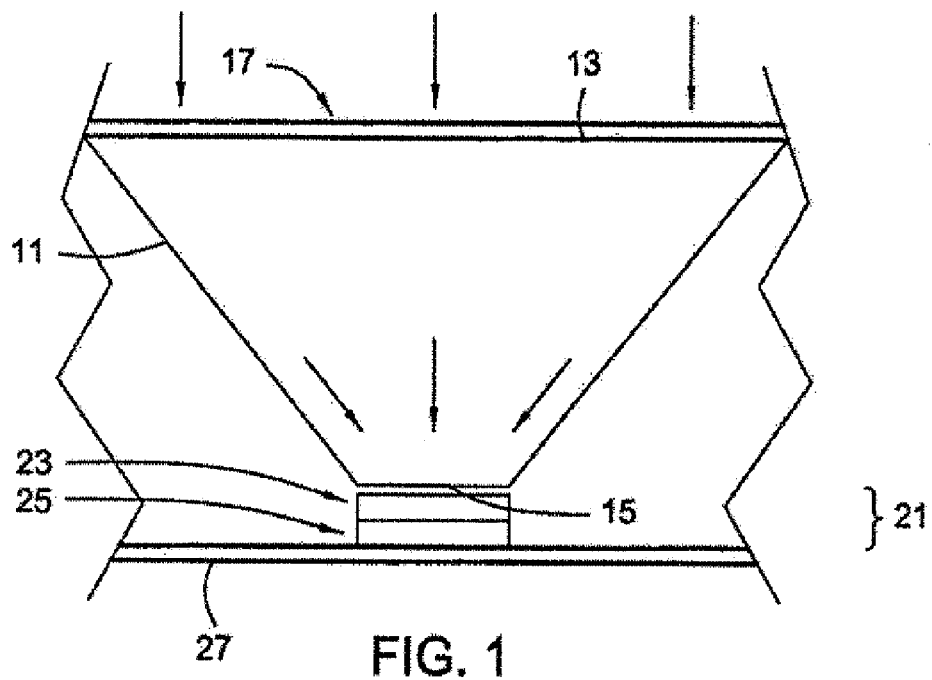
FIG. 1 is a sectional side view of one embodiment of an integrated solar energy conversion system constructed in accordance with the present invention.

Referring to FIG. 1, one embodiment of a system and apparatus for solar energy conversion constructed in accordance with the present invention is shown. The invention comprises a housing 11 that controls optical orientation and spacing. Housing 11 may be a conical or parabolic reflective surface, or still other shapes such as those known in the art (e.g., round, linear, square, hexagonal, etc. reflectors). Housing 11 has an upper opening 13 and a lower opening or aperture 15 located opposite the upper opening 13. One or more cover lenses 17 (e.g., a fresnel, convex, etc. lens) is positioned adjacent the upper opening 13 of the housing 11 for concentrating solar energy toward the lower opening 15 of the housing 11.

A package 21 for converting solar energy is positioned adjacent the lower opening 15 of the housing 11 opposite the cover lens 17. In one embodiment, the package 21 comprises a photovoltaic (PV) cell 23 for converting solar energy into electrical power, a thermionic (TI) or thermoelectric (TE) cell 25 (hereinafter, either or both are referred to as "TE cell") for converting waste heat into electrical power via thermionic or thermoelectric conversion, and a water circulation system 27 to remove excess thermal energy for various heating purposes. With the development of high temperature, semiconductor-based PV units, water circulation system 27 also may provide thermal-steam power energy generation.

In one embodiment, the PV cell 23 is located adjacent the aperture 15 and has an efficiency rating of about 6% to 34% for producing electrical power from solar energy. The water circulation system 27 maintains the PV cell 23 at an acceptable temperature for long life. In addition, the water circulation system 27 has an efficiency rating of about 25% to 50% for absorbing heat from solar energy. The TI or TE cell 25 has an efficiency rating of about 2% to 25% for producing electrical power from solar energy. Thus, overall, the package 21 harnesses more than about 50% of the solar energy incident on the package 21.

In the embodiment of FIG. 1, the TE cell 25 is positioned adjacent the PV cell 23 opposite the housing 11, and the water circulation system 27 is positioned adjacent the TE cell 25 opposite the PV cell 23.

Figure 2:
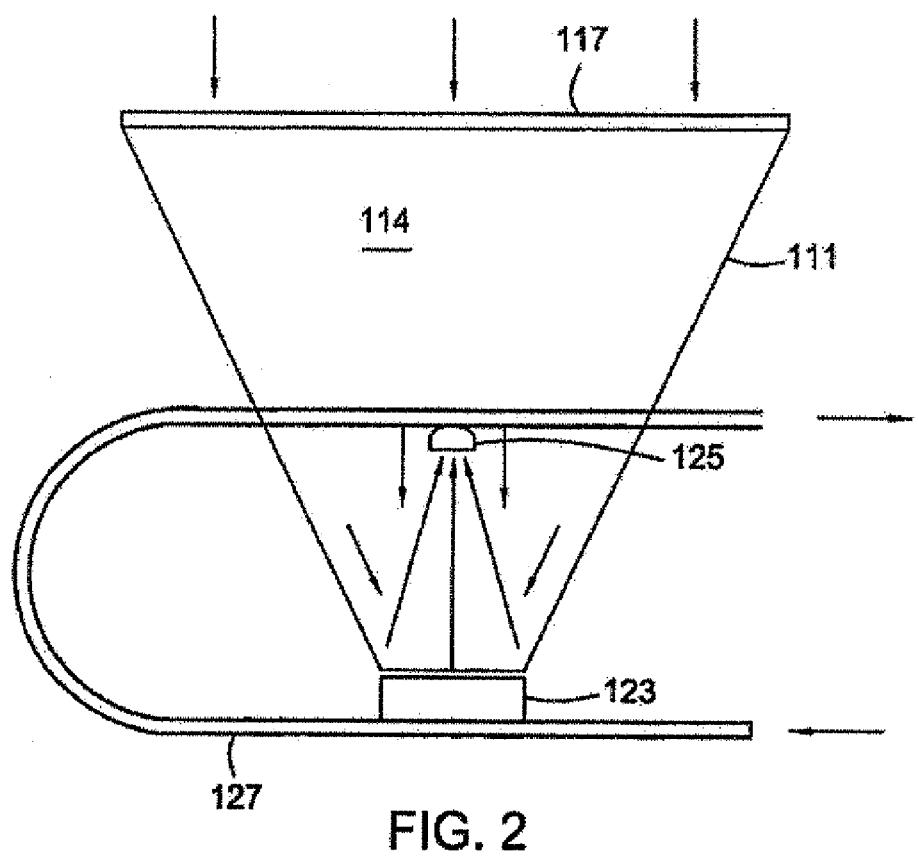
FIG. 2 is a sectional side view of another embodiment of an integrated solar energy conversion system constructed in accordance with the present invention.

In one alternate embodiment (FIG. 2), a TE cell 125 is positioned between a PV cell 123 and a cover lens 117 within a volume 114 of a housing 111. The water circulation system 127 is positioned adjacent the PV cell 123 and continues to the non-irradiated surface of TE cell 125. Improved efficiency is achieved by treating the irradiated surface of the PV cell 123 with one or more selective spectrum reflective coatings to allow high conversion PV wavelengths to pass through to the PV cell 123, and to reflect less efficient wavelengths to the absorption surface of the TE cell 125. In one embodiment, the solar radiation heated TE cells may be coated with high emissivity "blackbody" coatings for maximum absorption of all incident radiation. Alternatively, large installations may substitute thermal-steam or closed circuit Sterling power generation systems for the TE cells at economically feasible costs.

Figure 3:
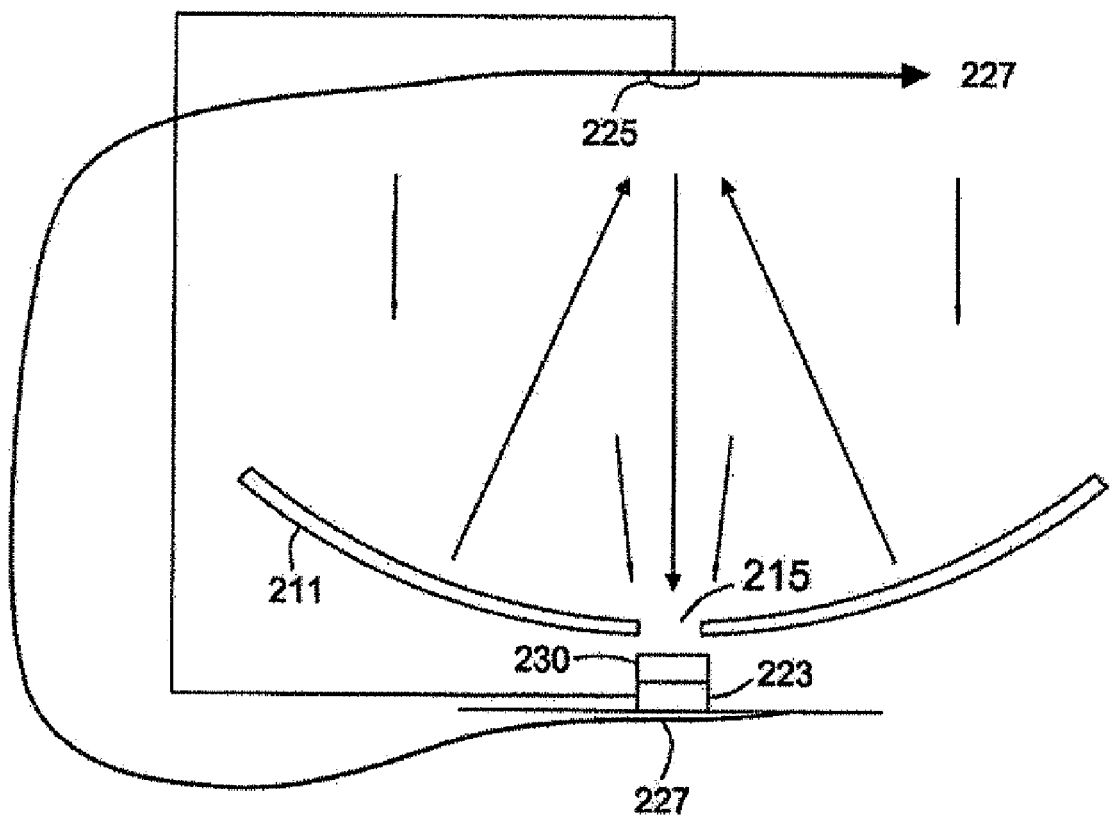
FIG. 3 is a sectional side view of still another embodiment of an integrated solar energy conversion system constructed in accordance with the present invention.

In another alternate embodiment (FIG. 3), a reflector 211 is positioned between a PV cell 223 and a TE cell 225 for directing reflected solar energy toward the TE cell 225. The water circulation system 227 is positioned adjacent the PV cell 223, opposite the reflected solar spectrum and continues adjacent to the TE cell 225, opposite the reflector 211. An aperture 215 is formed in the reflector 211 for permitting solar energy reflected from the surface of the TE cell 225 to be directed toward the PV cell 223. As discussed above, efficiency is increased by treating the irradiated surface of the TE cell 225 with selective spectrum reflecting/absorption coatings directing high PV conversion wavelengths to the PV cell 223 and absorbing less efficient wavelengths on the surface of the TE cell.

Alternatively, an optional optical cover 230 may be provided for the PV cell 223. Optical cover 230 may be treated with anti-reflective coatings and also may incorporate phosphors to shift the wavelength of incident radiation to wavelengths that are more efficiently converted by the PV cell 223. The inclusion of phosphor is just in front of the PV cell, rather than elsewhere in the solar energy path where diffusion would reduce power flux to the target cells.

Figure 4:
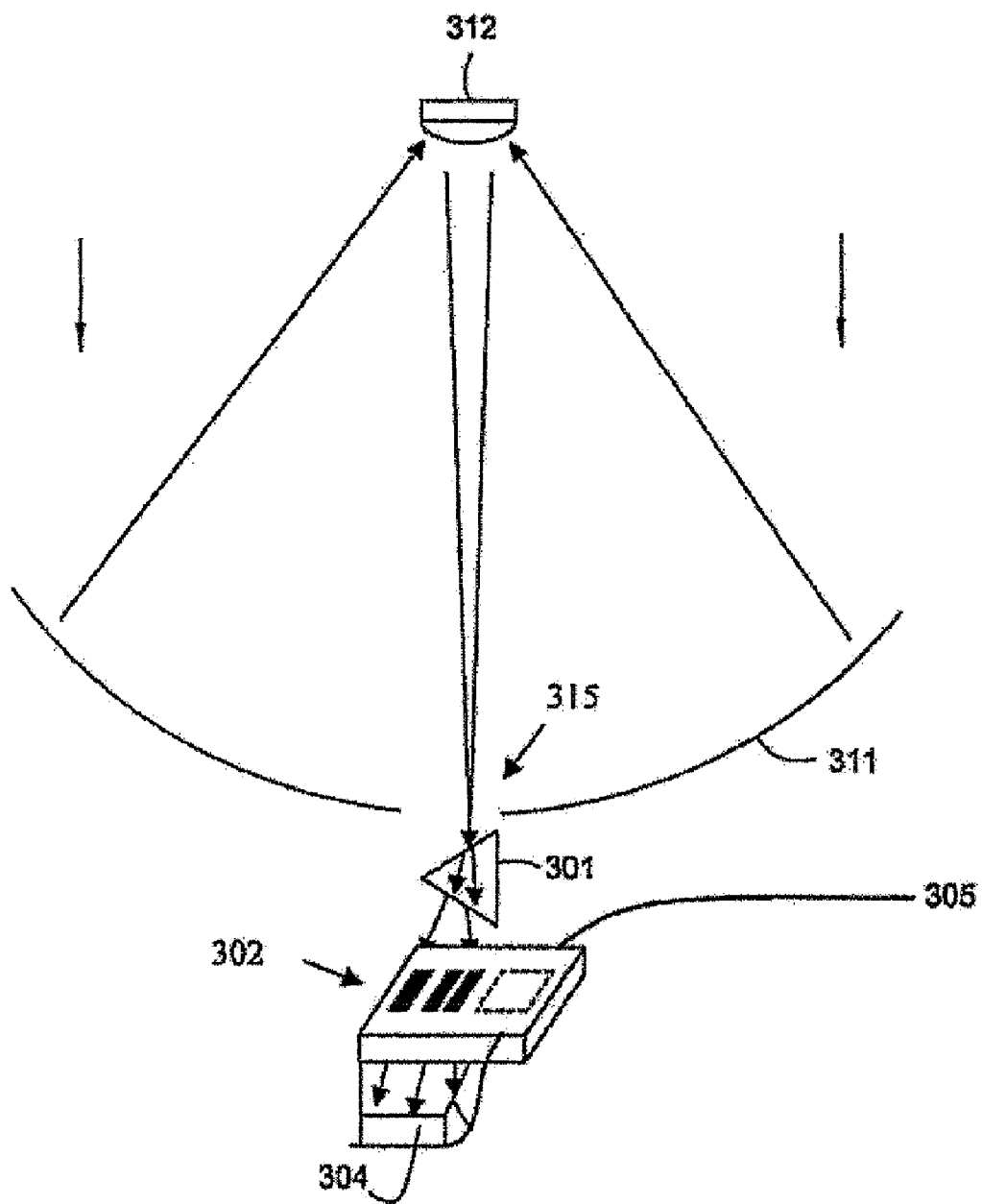
FIG. 4 is a sectional side view of yet another embodiment of an integrated solar energy conversion system constructed in accordance with the present invention.

In another alternate embodiment (FIG. 4), linear (e.g., trough) reflectors 311, 312 collimate and direct solar radiation through aperture 315 to a prism 301 that separates the light spectrum into various wavelengths. A highly thermally conductive slotted plate with an embedded TE cell 302 passes the high efficiency photovoltaic wavelengths onto the PV cell 304 and absorbs the remaining spectrum as thermal energy. The water circulation system 305 is positioned adjacent the PV cell 304 and the TE cell 302 opposite incident radiation. This embodiment precisely partitions the spectrum for greater utilization of the solar energy by the most efficient device for each wavelength in the solar spectrum.

Figure 5:
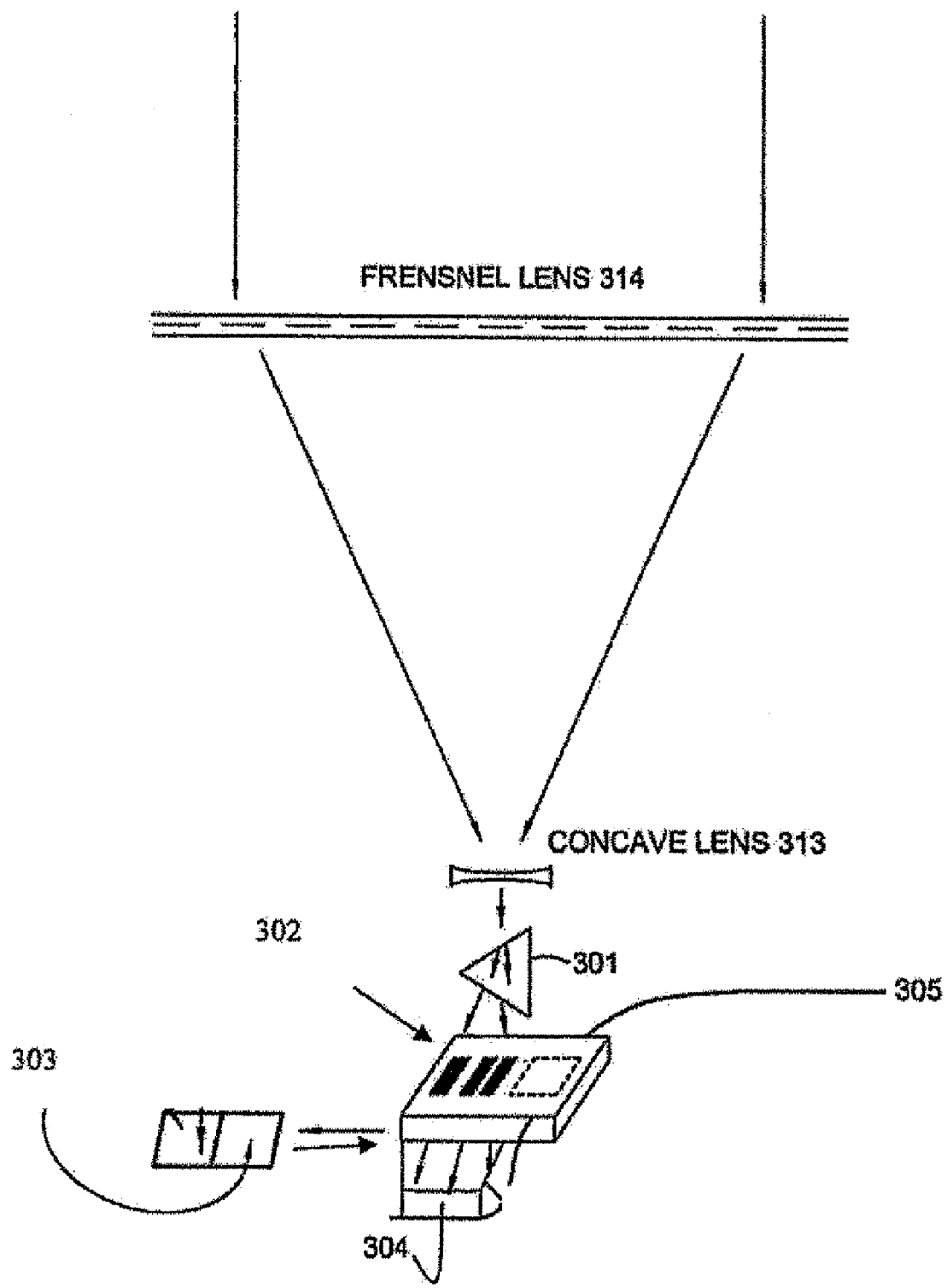
FIG. 5 is a sectional side view of another embodiment of an integrated solar energy conversion system constructed in accordance with the present invention.

In still other embodiments (FIG. 5), a heat pipe 303 conducts thermal energy from the slotted wavelength separator 302 to the TE cell 302. Alternatively, a stack of wavelength specific filters may be used to absorb non-optimum PV wavelengths, transfer them to a heat pipe, which conducts the thermal energy to the TE cell. In yet another alternative, a primary fresnel lens 314 is used to concentrate the spectral solar radiation to a secondary concave collimating lens 313 directing the beam to the prism 301 for separating the into wavelengths for optimum utilization in energy conversion. In addition, a heat absorption cell for a thermal-steam powered or sterling engine energy generation system may be used to replace the TE cell, which would efficiently utilize the highly concentrated heat source for efficient operation.

Figure 6:
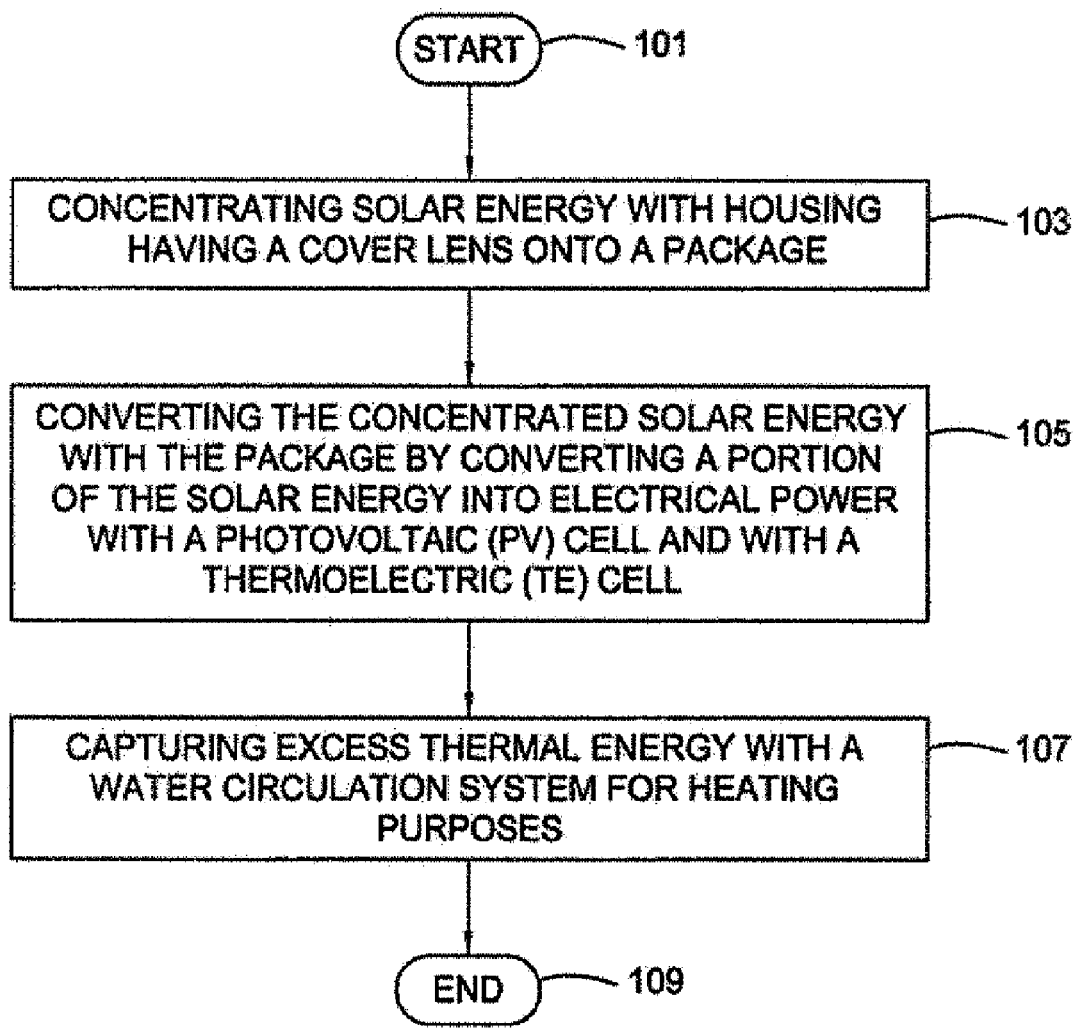
FIG. 6 is a high level flow diagram of one embodiment of a method in accordance with the present invention.

Referring now to FIG. 6, one embodiment of a method of converting solar energy into usable energy is illustrated. The method starts as indicated at step 101, and comprises concentrating solar energy with a housing having a cover lens onto a package (step 103); converting the concentrated solar energy with the package by (i) converting a portion of the solar energy into electrical power with a photovoltaic (PV) cell and with a thermoelectric (TB) cell (step 105), and (ii) capturing excess thermal energy with a water circulation system for heating purposes (step 107), before ending as indicated at step 109.

The method also may comprise providing the housing with a shape selected from the group consisting of parabolic, conical, round, linear, square, and hexagonal reflectors; and the cover lens is selected from the group consisting of a fresnel lens and a convex lens, and is positioned adjacent an incoming solar radiation end of the housing. Alternatively, the method may comprise providing the housing with an aperture located opposite the cover lens; and further comprising locating the PV cell adjacent the aperture, the PV cell having an efficiency rating of about 6% to 34% for producing electrical power from solar energy; and the TE cell having an efficiency rating of about 2% to 25% for producing electrical power from solar energy.

In another embodiment, the method may comprise reducing a temperature of the PV cell with the water circulation system to extend a useful life of the PV cell, the water circulation system having an efficiency rating of about 25% to 50% for absorbing heat from solar energy, and the package harnessing over 50% of the solar energy incident on the package;

or positioning the TE cell adjacent the PV cell opposite the housing, and positioning the water circulation system adjacent the TE cell opposite the PV cell; or positioning the TE cell between the PV cell and the cover lens within a volume of the housing, and positioning the water circulation system adjacent the PV cell and adjacent the TE cell, opposite the incident solar energy; or positioning the housing between the PV cell and the TE cell for directing reflected solar energy toward the TE cell, positioning the water circulation system adjacent non-irradiated sides of the PV and TI cells, and forming an aperture in the housing for permitting solar energy not absorbed by the TE cell to be directed toward the PV cell.

The method may further comprise covering the PV cell with an optical phosphor that shifts non-optimum wavelengths to optimum wavelengths for greater energy conversion, and collimating solar flux with a secondary reflector towards a prism to separate wavelengths and a slotted thermal plane passes PV efficient wavelengths to the PV cell and absorbs the remaining wavelengths for conduction to the TE cell; or conducting thermal energy with a heat pipe from a slotted wavelength separator to the TE cell, and absorbing non-optimum PV wavelengths with a stack of wavelength specific filters, and transferring them to a heat pipe that conducts thermal energy to the TE cell; or concentrating spectral solar radiation with a primary fresnel lens to a secondary concave collimating lens and directing a light beam to the prism for separation into wavelengths for enhanced solar energy conversion; and wherein the TE cell is a heat absorption cell for a system selected from the group consisting of a thermal-steam powered energy generation system and a Sterling engine system.

While the invention has been shown or described in only some of its forms, it should be apparent to those skilled in the art that it is not so limited, but is susceptible to various changes without departing from the scope of the invention. For example, each embodiment requires the use of a conventional sun tracking system, including azimuth, elevation, etc., such as those known in the art.

What is claimed is:

1. A solar energy conversion system, comprising:
   a photovoltaic (PV) cell;
   a thermoelectric (TE) cell in thermal communication with the PV cell;
   a collimating primary reflector having an aperture above the PV and TE cells;
   a collimating secondary reflector positioned above the primary reflector to receive reflected collimated solar flux from the primary reflector, and reflect the collimated solar flux received towards the aperture;
   a prism mounted below the aperture and above the PV and TE cells to separate PV efficient wavelengths from the collimated solar flux reflected by the secondary reflector; and
   a slotted thermal plate located between the prism and the PV cell, the thermal plate passing the PV efficient wavelengths to the PV cell and the slotted thermal plate absorbing the remaining wavelengths for conduction to the TE cell.

2. A solar energy conversion system according to claim 1, wherein the PV cell is covered with an optical phosphor that shifts non-optimum wavelengths to optimum wavelengths for greater energy conversion.

3. A solar energy conversion system according to claim 1, wherein a heat pipe conducts thermal energy from the slotted thermal plate to the TE cell.

4. A solar energy conversion system according to claim 1, wherein a stack of wavelength specific filters absorbs non-optimum PV wavelengths, transfers them to a heat pipe, which conducts thermal energy to the TE cell.

5. A solar energy conversion system according to claim 1, further comprising a liquid circulation system in thermal communication with the TE cell.

6. A solar energy conversion system according to claim 1, wherein the TE cell is a heat absorption cell for a system selected from the group consisting of a thermal-steam powered energy generation system and a Sterling engine system.

7. A solar energy conversion system according to claim 1, wherein the primary reflector comprises a pair of reflectors assembled to define a trough, with the aperture being at a bottom of the trough.

8. A solar energy conversion system, comprising:
   a photovoltaic (PV) cell;
   a thermoelectric (TE) cell adjacent and in thermal communication with the PV cell;
   a pair of linear collimating primary reflectors positioned adjacent each other to define an upward facing trough with a bottom having an aperture, the aperture being positioned above the PV and TE cells;
   a collimating secondary reflector positioned above the primary reflector to receive reflected collimated solar flux from the primary reflector, and reflect the collimated solar flux received through the aperture;
   a prism mounted below the aperture and above the PV and TE cells to separate PV efficient wavelengths from the collimated solar flux reflected by the secondary reflector;
   a slotted thermally conductive plate located below the prism and above the PV cell, the thermal plate passing the PV efficient wavelengths to the PV cell and absorbing and conducting the remaining wavelengths to the TE cell; and
   a liquid circulation system in thermal communication with the TE cell.

9. A solar energy conversion system according to claim 8, wherein a heat pipe conducts thermal energy from the plate to the TE cell.

10. A solar energy conversion system, comprising:
    a photovoltaic (PV) cell;
    a thermoelectric (TE) cell adjacent and in thermal communication with the PV cell;
    upper and lower optical devices positioned above the PV and TE cells for directing collimated solar flux downward towards the PV and TE cells;
    a prism mounted below the lenses and above the PV and TE cells to separate PV efficient wavelengths from the collimated solar flux received from the lenses;
    a flat slotted thermally conductive plate located below the prism and above the PV cell, the thermal plate passing the PV efficient wavelengths to the PV cell and absorbing and conducting the remaining wavelengths to the TE cell; and
    a liquid circulation system below the thermally conductive plate in thermal communication with the TE cell to remove heat from the TE cell.

11. A solar energy conversion system according to claim 10, wherein:
    the lower optical device comprises a generally concave collimating reflector having an aperture positioned above the PV and TE cells; and
    the upper optical device comprises a generally convex collimating reflector that receives reflected solar flux from the lower optical device and reflects the reflects the solar flux through the aperture to the prism.

12. A solar energy conversion system according to claim 10, wherein:
the upper optical device comprises a Fresnel lens that collimates solar flux downwardly; and
the lower optical device comprises a lens having concave upper and lower surfaces for further collimating the solar flux and directing it to the prism.

* * * * *